United States Patent [19]

Okada et al.

[11] Patent Number: 4,635,282

[45] Date of Patent: Jan. 6, 1987

[54] X-RAY SOURCE AND X-RAY LITHOGRAPHY METHOD

[75] Inventors: Ikuo Okada; Yasunao Saitoh, both of Isehara; Hideo Yoshihara, Yokohama; Satoshi Nakayama, Sayama, all of Japan

[73] Assignee: Nippon Telegraph & Telephone Public Corp., Tokyo, Japan

[21] Appl. No.: 699,402

[22] Filed: Feb. 7, 1985

[30] Foreign Application Priority Data

Feb. 14, 1984 [JP] Japan .................................. 59-24496

[51] Int. Cl.⁴ ............................................. G21K 5/00
[52] U.S. Cl. ........................................ 378/34; 378/35; 378/83; 250/281; 250/282; 250/399; 250/492.2; 250/505.1
[58] Field of Search ............................. 378/34, 35, 83; 250/492.2, 505.1, 399, 281-282

[56] References Cited

U.S. PATENT DOCUMENTS 3,471,694 10/1969 Poen ........................................ 378/83
3,614,424 10/1971 Openshaw ............................. 378/83*
4,514,858  4/1985 Novak .................................... 378/34

OTHER PUBLICATIONS

A. Fisher et al, "Fast Valve for Gas Injection into Vacuum," *Review of Scientific Instruments*, vol. 49, No. 6, (Jun. 1978), pp. 872–873, American Institute of Physics, New York, U.S.
R. A. Gutcheck et al, "Intense Plasma Source for X-ray Microscopy," *Society of Photo-Optical Instrumentation Engineers* (SPIE), vol. 316, (1981), pp. 196–202.
W. Clark et al, "The Dynamics of Imploding Argon Plasmas," *Journal of Applied Physics*, vol. 53, No. 8, (Aug. 1982), pp. 5552–5556, American Institute of Physics.
J. Bailey et al., "Evaluation of the Gas Puff Z Pinch as an X-ray Lithography and Microscopy Source", *Appl. Phys. Lett.*, (40 (1)), 1 Jan. 1982, pp. 33–35.
C. Stallings et al., "Imploding Argon Plasma Experiments", *Appl. Phys. Lett.*, 35(7), 1979, pp. 524–526.
J. S. Pearlman et al., "X-ray Lithography Using a Pulsed Plasma Source", *J. Vac. Sci. Technol.*, 19(4), Nov./Dec. 1981, pp. 1190–1193.

*Primary Examiner*—Craig E. Church
*Assistant Examiner*—John C. Freeman
*Attorney, Agent, or Firm*—Spencer & Frank

[57] ABSTRACT

A gas injection type plasma X-ray source has a gas plenum for storing a discharging gas at a pressure in the range of 150 Torr and 1000 Torr, the stored gas being injected between a pair of electrodes through a gas valve. The electrodes are opposed to each other in a vacuum vessel, so that a gas jet for the production of a plasma is formed. A voltage is applied between the electrodes, so that a discharge plasma is produced between said electrodes. A linear plasma with a high temperature and a high density is produced by the pinch of the plasma due to its own magnetic field produced by the current flowing through the plasma, so that X-rays are emitted from the linear plasma. The X-ray source has a high conversion efficiency and a high discharge timing margin, and accordingly the stability and reproducibility of discharges are improved and the X-ray output is increased.

18 Claims, 18 Drawing Figures

10mm

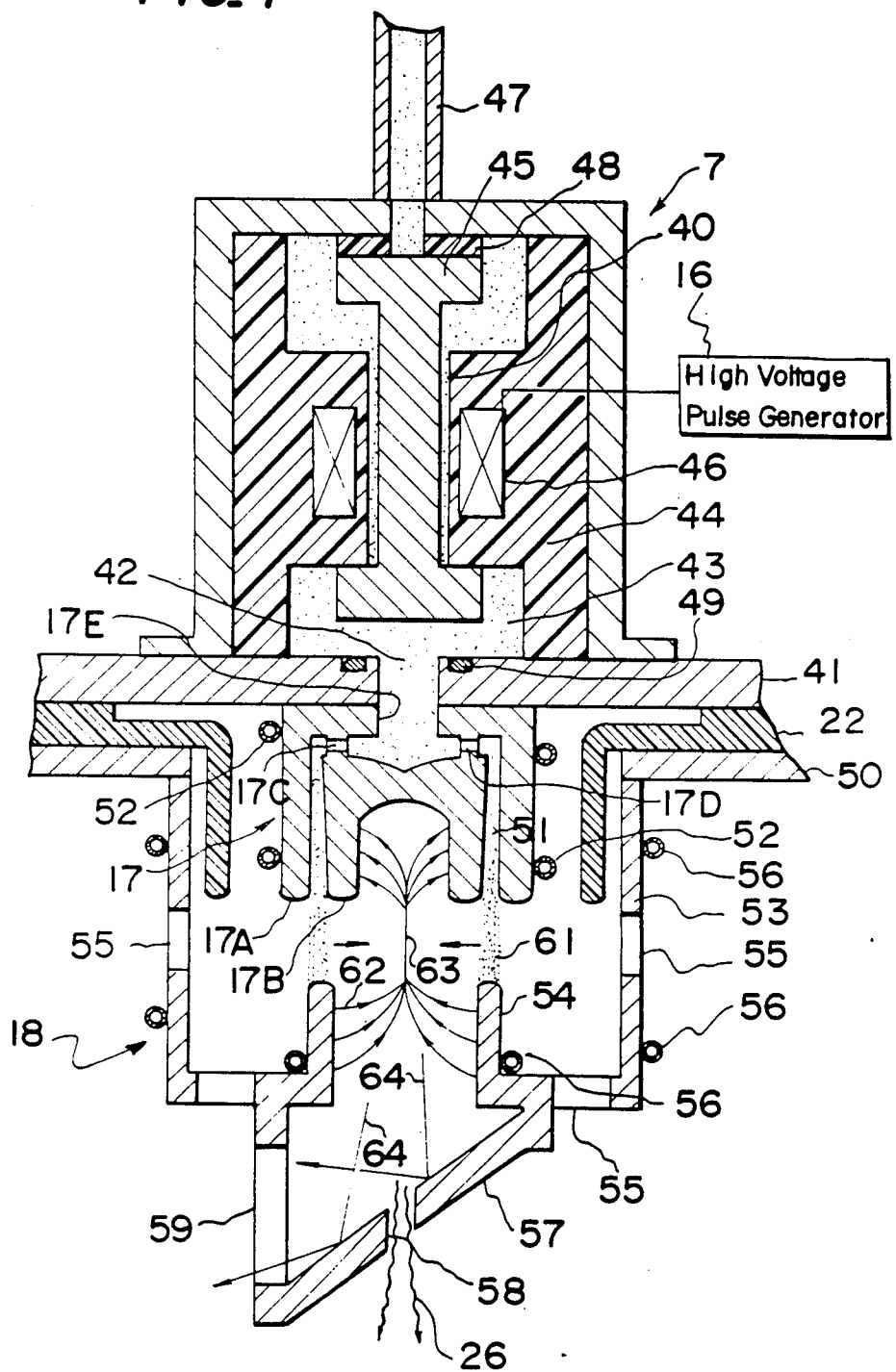

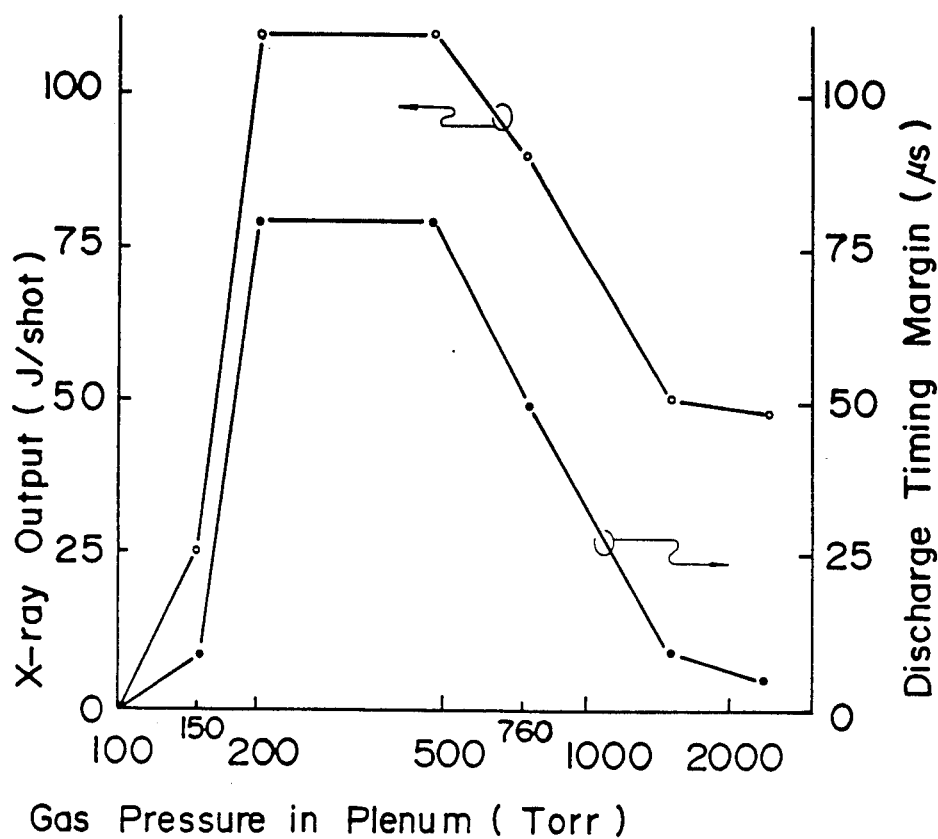
FIG_7B
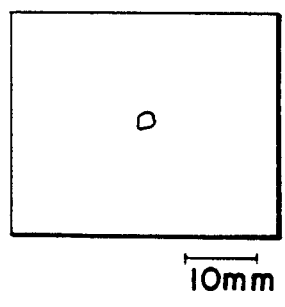
FIG_8
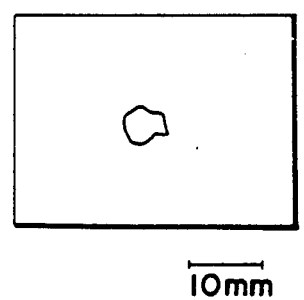
FIG_9

FIG_10
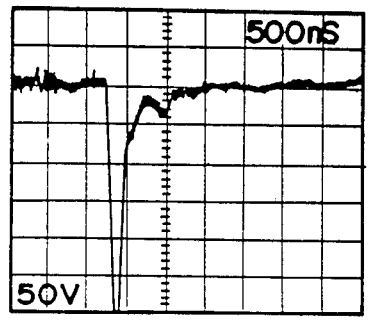
FIG_11
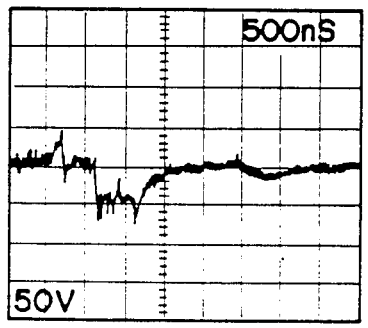
FIG_12
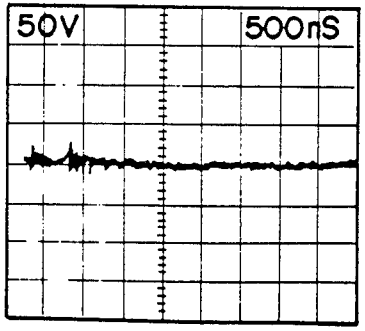

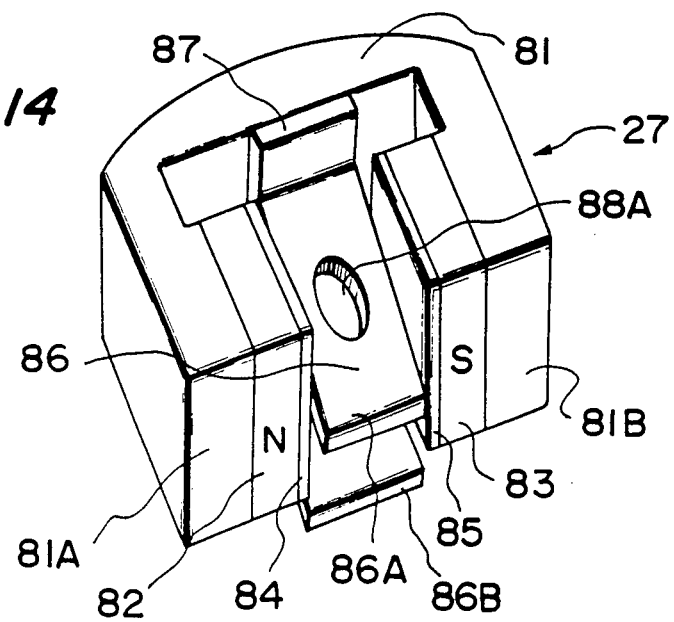
FIG_14
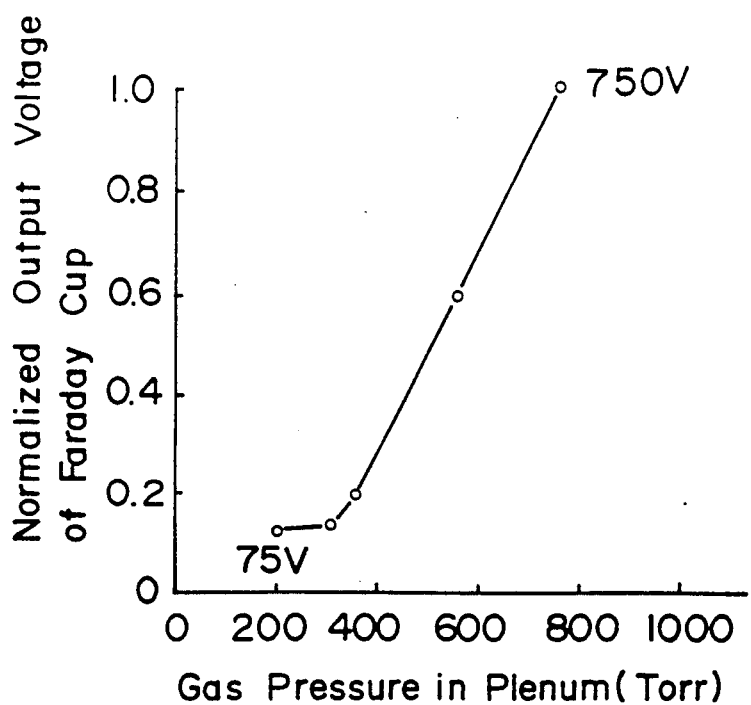
FIG_15

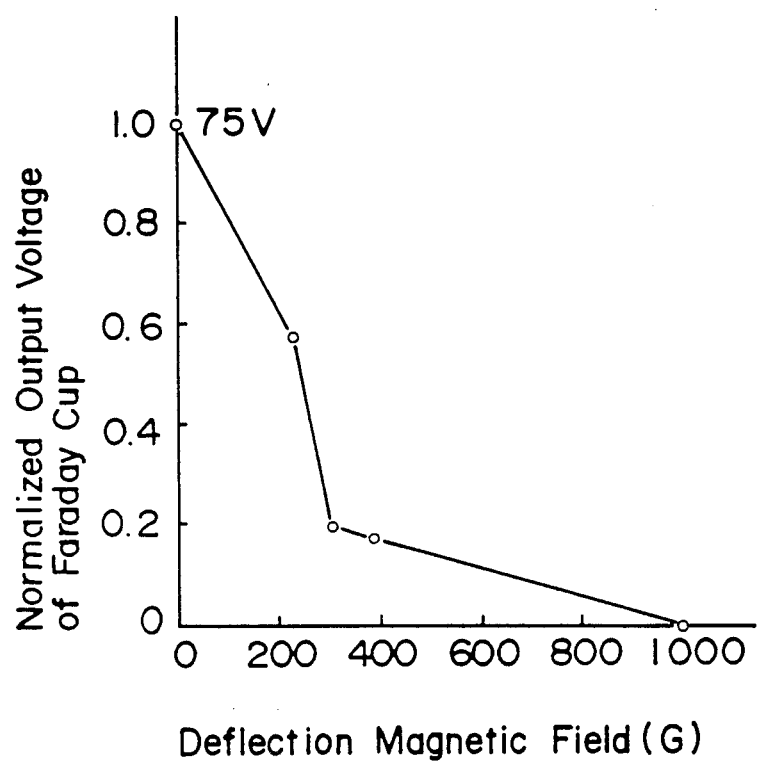
FIG_16

X-RAY SOURCE AND X-RAY LITHOGRAPHY METHOD

BACKGROUND OF THE INVENTION

1. Field of the Invention

The present invention relates to a plasma X-ray source for generating high output and highly stable soft X-rays to be used in an exposure apparatus for replicating a fine pattern to be used in the fabrication of semiconductor integrated circuits, and an X-ray lithography method utilizing the X-ray source.

2. Description of the Prior Art

One of the lithography processes which play a very important role in the fabrication of integrated circuits is an X-ray lithography. So far an electron beam impact source in which X-rays are generated by the bombardment of an electron beam against a target consisting of Al, Cu, Mo, Si, Pd or the like has been used as a soft X-ray source of an X-ray exposure apparatus. However, this source has the problem that the X-ray generating efficiency is as low as 0.01%, so that high output X-rays cannot be obtained and consequently the pattern replication yield is low.

On the other hand, a plasma X-ray source utilizing a high density plasma has a high X-ray generating efficiency, so that it is expected that high output X-rays are obtained. The efficiency of the conversion of the energy applied to a plasma X-ray source into soft X-rays is higher than 1%, so that a high efficiency hundred times as high as the efficiency of an electron beam impact X-ray source is expected.

In the case of a plasma X-ray source, a plasma is produced by a discharge. A large current of the order of hundreds kA flows through the plasma so that the plasma is caused to pinch by its own magnetic field produced by the current and the electromagnetic action of the plasma to produce a high temperature and high density plasma. X-rays are emitted from the high temperature and high density plasma. Since the plasma is produced by flowing a large current as described above, there arise the problems of stability in X-ray intensity, electrode consumption and damage to an X-ray extraction window by a plasma. As a result, it is extremely difficult in practice to use the plasma X-ray source as an X-ray exposure source.

Gas injection type plasma X-ray sources are disclosed in the following papers:

(1) "X-ray lithography using a pulsed plasma source", Pearlman et al., J. Vac. Sci. Technol., 19(4), Nov./Dec. 1981, pp. 1190–1193;

(2) "Evaluation of the gas puff Z pinch as an X-ray lithography and microscopy source", J. Bailey et al., Appl. Phys. Lett. 40(1), Jan. 1, 1982, pp. 33–35; and (3) "Imploding argon plasma experiments", C. Stallings et al., Appl. Phys. Lett. 35(7), 1979, pp. 524–256.

FIG. 1 shows a gas injection type plasma X-ray source which is disclosed in these papers. In FIG. 1, reference numeral 1 denotes a vacuum vessel; 7, a fast acting puff valve; 13, a capacitor; 17, a gas injection electrode; 18, a mesh electrode; 21, a switch; 26, X-rays produced; 28, an X-ray extraction window of a Be film; 29, an X-ray mask; 30, a wafer; 43, a gas plenum provided in the fast acting puff valve; 45, a piston; 61, a gas jet; 63, a pinched plasma; and 64, a stream or group of charged particles. In a gas injection discharge method, the gas stored in the gas plenum 43 is instantaneously forced into the space between the electrodes 17 and 18 which are in opposed relationship with each other in the vacuum vessel 1 by driving the piston 45 of the fast acting puff valve 7 at a high speed, whereby the gas jet 61 is formed between the electrodes 17 and 18. Thereafter, the switch 21 is closed so that a voltage is applied between the electrodes 17 and 18 from the capacitor 13, which is charged. As a result, the gas jet 61 is ionized by a discharge and is converged by a current, so that a plasma is pinched toward the center. Thus, the high temperature and high density plasma 63 is produced.

In the gas injection discharge method, it is necessary that the rising slope of the injected gas be formed as steeply as possible, so that when the gas jet is formed between the electrodes, it has a gas density adapted to cause a discharge before the gas jet is diffused. The time variation in the flow rate Q of the gas which flows when the piston 40 of the fast acting puff valve is opened is expressed by the following equation:

$$Q \propto \frac{Po}{l} \exp(-l^2/4 Dt)$$

where
  Po: the gas pressure of the plenum in the fast acting puff valve 7;
  D: conductance of the passage through which the gas flows; and
  l: distance of the gas passage.

The above equation shows that in order to obtain a steep gas profile, by increasing the volume of the flowing gas as much as possible, the high gas pressure Po is adopted usually. Therefore, in the prior art, the fast acting puff valve usually introduces the gas at a high pressure of about 5 atm. so that the gas injection velocity is increased.

Meanwhile, in the prior art, a gas is injected between the electrodes by operating the fast acting gas valve with a high plenum gas pressure, as described above, so that the gas density between the electrodes reaches a high value in the range of $1 \times 10^{20} - 1 \times 10^{22}$ cm$^{-3}$. Moreover, it takes about 0.1 ms to open or close the fast acting puff valve. Therefore, the gas density between the electrodes is increased after the gas jet is formed and discharged between the electrodes, and then the plasma 44 is pinched. As a result, the gas density is increased during the discharge caused by the current flowing after the plasma has been pinched. Therefore, a high pressure arc discharge, which is one of the characteristics of a discharge at a high gas pressure, occurs so that the electrodes are locally heated. As a consequence, the melting of electrodes is accelerated and the electrodes are consumed so that the materials of the electrodes contaminate the inner walls of the vessel. Furthermore, high energy electrons and ions and high temperature gases which are produced by the discharge are increased.

When such a high temperature and high density plasma is used as an X-ray exposure source, electrode consumption degrades discharge reproducibility and the stability of X-ray emission. Furthermore, the breakdown voltage of an insulator is decreased because of the adhesion of electrode materials to the surfaces of the insulator to which a high voltage is applied. When the plasma X-ray source is used as an X-ray exposure source, the transmissivity of X-rays through the X-ray extraction window 28 is decreased because of the deposition of the electrode materials on the X-ray window.

As a result, a continuous X-ray exposure is impossible. Moreover, because the gas density between the electrodes reaches a high value, the high energy charged particles and high temperature gases impinge against the X-ray extraction window, so that the X-ray extraction window 28 is damaged.

Especially, when the plasma 63 is produced by the gas jet 61 along the axis of the electrodes as shown in FIG. 1, a large amount of high energy charged particles such as ions and electrons are emitted in the direction of the axis of the plasma 63. As a result, even when the X-ray extraction window 28 is located in the direction of the axis of the plasma, it is seriously damaged, so that it is impossible to make an exposure. Therefore, as shown in FIG. 1, the X-ray window 28, the X-ray mask 29 and the wafer 30 are located in the radial direction of the pinched plasma 63 and an exposure is made in vacuum.

FIG. 2 shows an X-ray pin-hole picture photographed in the radial direction of the X-ray source through a Be film which is disposed at the position of pattern replication. When a proximity exposure method is employed, the X-ray source becomes linear so that a viewing angle is increased and the replicated pattern is largely blurred. As a consequence, it is impossible to replicate a fine pattern. In view of this, when a conventional gas injection type plasma X-ray source is used, it is only possible to make an exposure in a radial direction of the X-ray source, so that the X-ray source is not suitable as an X-ray source for the exposure of a fine pattern.

In addition, when a gas is injected at a high pressure, a large volume of gas is introduced, so that it takes a long time to exhaust the gas in the vacuum vessel. As a result, in the gas injection type X-ray source, it is impossible to repeat discharges at a high repetition rate.

Furthermore, when an X-ray source is used for exposure, the charged particles which impinge against the X-ray extraction window must be reduced as much as possible. So far, no satisfactory method has been proposed to overcome this problem.

SUMMARY OF THE INVENTION

One of the objects of the present invention is, therefore, to provide a plasma X-ray source which substantially overcomes the problems encountered in the gas injection type plasma technique with a high X-ray conversion efficiency, and which has a wide discharge timing margin, whereby the discharge stability and the X-ray emission reproducibility are enhanced.

Another object of the present invention is to provide a plasma X-ray source in which continuous discharges are possible at a high repetition rate and which is capable of replicating a fine pattern.

A further object of the present invention is to provide an X-ray source which reduces the charged particles produced by a discharge and/or which removes the charged particles thus produced so that X-rays can be obtained in the direction of the axis of the plasma, and so that damage to the X-ray window due to high velocity particles emitted from the plasma is prevented.

A yet further object of the present invention is to provide an X-ray lithography method for replicating a fine pattern by utilizing a plasma X-ray source which has a wide margin of discharge timing, a high degree of discharge stability and an improved X-ray emission reproducibility.

The inventors discovered that the discharge can be produced in a stable manner with the discharge timing margin becoming rather wider than in the prior art, even when the plenum gas pressure is less than that of the prior art and the gas rising slope is not so steep as in the prior art. The present invention is based on the recognition of these phenomena. Also, a new electrode structure was invented in order to compensate for the decrease of the steepness of the gas rising slope due to lowered pressure and to increase the gas conductance of the gas passage. Moreover, the present invention has means for removing the particle beam emitted from the plasma in order to reduce the detrimental effect of the particle beam.

In a first aspect of the present invention, an X-ray source comprises: a gas plenum for storing a gas at a pressure in the range of 150 Torr and 1000 Torr; a pair of electrodes opposed to each other in a vacuum vessel; a gas valve for injecting the stored gas between the electrodes so that a gas jet for the production of a plasma is formed; and means for applying a voltage between the electrodes to perform discharge therebetween so that a discharge plasma is produced between the electrodes; a linear plasma with a high temperature and a high density being produced by the pinch of the plasma due to its own magnetic field produced by the current flowing through the plasma, so that X-rays are emitted from the linear plasma.

Here, it is preferable that the pressure in the gas plenum is so controlled that the maximum gas molecular density of the gas jet does not exceed $10^{19} cm^{-3}$.

The gas valve may be a fast acting puff valve which is opened by an electromagnetic force and which is closed by the weight of the gas valve. The gas jet may be in the form of a solid or hollow cylinder.

The pair of electrodes can be opposed to each other substantially in coaxial relationship, and at least one of the pair of electrodes may have a center hole, so that X-rays are extracted in the direction of the axis of the linear plasma produced substantially along the axis of the pair of electrodes. Here, one of the pair of electrodes, on the side that the X-rays are extracted, can be grounded, while a negative potential can be applied to the other electrode. One of the pair of electrodes, without the center hole, may be in the form of a hollow cylinder and is directly coupled to the gas valve, so that the gas is ejected from the interior of the one electrode, and the one electrode may have an inner coaxial cylindrical electrode connected electrically to the one electrode. The pair of electrodes may comprise a pair of hollow cylindrical electrodes disposed in coaxial relationship with each other.

The X-ray source may further comprise a reflector with an X-ray passing window which is interposed between the pair of electrodes and an X-ray extraction window located below the pair of electrodes along the axis of the pair of electrodes.

The X-ray source may further comprise a reflector with an X-ray passing window which is interposed between the pair of electrodes and an X-ray extraction window located below the pair of electrodes along the axis of the pair of electrodes. Here, the reflector may have a reflecting plane which is inclined at a predetermined angle relative to the axis of the pair of electrodes. Here, the X-ray source may further comprise an evacuation system which is coupled to the vacuum vessel to evacuate the inside of the vacuum vessel, and the reflecting plane may be opposed to the evacuation system.

The reflector may have a plurality of charged particle reflecting portions which are spaced apart from each other.

The X-ray source may further comprise a charged particle remover which has an X-ray passing window and is coaxial with the axis of the pair of electrodes, and the charged particle remover can be interposed between the pair of electrodes and an X-ray extraction window located below the pair of electrodes.

The charged particle remover may have a magnet which is so disposed as to produce a magnetic field for deflecting the incoming charge particles. The magnetic field can be produced in the direction perpendicular to the direction of extracting the X-rays. The reflecting plane of the reflector can be disposed in the magnetic field.

The X-ray source may further comprise a magnetic shielding plate which has an X-ray passing window and has a high permeability, and the magnetic shielding plate can be interposed between the pair of electrodes and the plasma remover.

In another aspect of the present invention, an X-ray lithography method comprises the steps of: forming a gas jet for the production of a plasma between a pair of electrodes substantially in coaxially opposed relationship with each other in a vacuum vessel, at least one of the pair of electrodes having a hole for passing X-rays; controlling the maximum gas molecular density of the gas jet so as not to exceed $10^{19}$ cm$^{-3}$; applying a voltage between the pair of electrodes to perform discharge therebetween so that a discharge plasma is produced between the pair of electrodes, a linear plasma with a high temperature and a high density being produced by the pinch of the plasma due to its own magnetic field produced by the current flowing through the plasma, so that X-rays are emitted from the linear plasma in the direction of the axis of the linear plasma and substantially along the axis of the pair of electrodes; and exposing a wafer by the emitted X-rays through an X-ray exposure mask, the X-ray exposure mask and the wafer being so arranged along the axis of the linear plasma so that the surfaces of the X-ray exposure mask and the wafer are perpendicular to the axis of the linear plasma.

Here, the surfaces of the X-ray exposure mask and the wafer can be disposed substantially horizontally. It is preferable that the pressure of the gas to be injected to form the gas jet is in the range of 150 Torr and 1000 Torr. It is most preferable that the pressure of the gas to be injected to form the gas jet is in the range of 150 Torr and 500 Torr.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 4 is a sectional view, on enlarged scale, thereof showing the detailed construction of the discharge electrodes;

FIG. 7B illustrates the relationship between the pressure of the introduced gas and the X-ray output and the relationship between the gas pressure of plenum and the discharge timing margin;

FIG. 8 illustrates an X-ray pin-hole picture obtained with an X-ray source in accordance with the present invention;

FIG. 9 illustrates an X-ray pin-hole picture obtained with a conventional X-ray source in which a gas is injected at a high pressure;

FIG. 10 illustrates the result of the experiment conducted for measuring an amount of charged particles emitted when discharge is performed with Ne gas at a plenum gas pressure of 2 atm. without the provision of the beam reflector;

FIG. 11 illustrates the result of the experiment conducted under the same conditions as in FIG. 10 except that discharge is performed at a plenum gas pressure of 300 Torr;

FIG. 12 illustrates the result of the experiment conducted for measuring particles when discharge is performed at a plenum gas pressure of 300 Torr by a gas passed through the beam reflector and the charged particle remover;

FIG. 14 is a perspective view of the beam remover;

FIG. 15 illustrates the relationship between a plenum gas pressure and a normalized Faraday cup output voltage corresponding to an amount of charged particles emitted from the plasma; and FIG. 16 illustrates the relationship between a deflection magnetic field intensity and a normalized Faraday cup output voltage corresponding to an amount of charged particles traveling through the magnetic field.

DETAILED DESCRIPTION OF THE PREFERRED EMBODIMENTS

Figure 1:
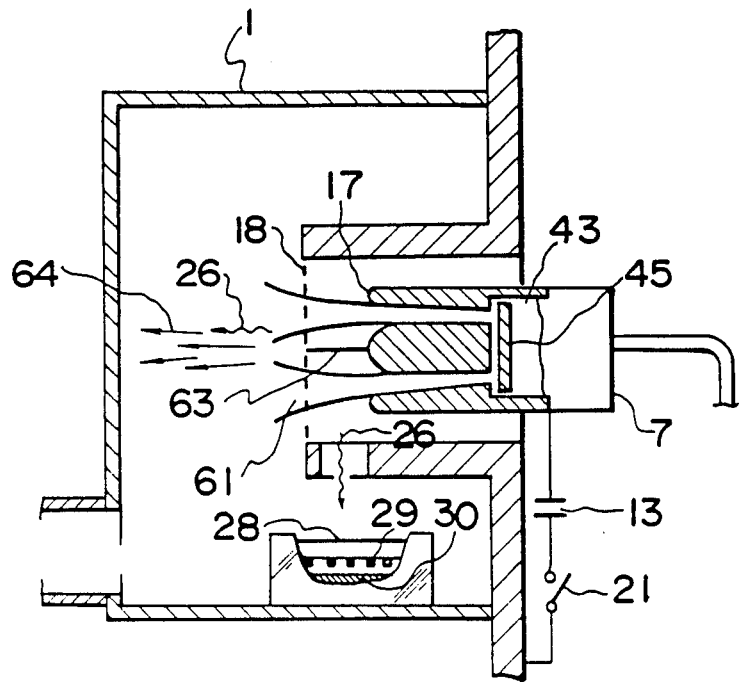
FIG. 1 is a schematic view showing a conventional plasma X-ray source.
Figure 2:
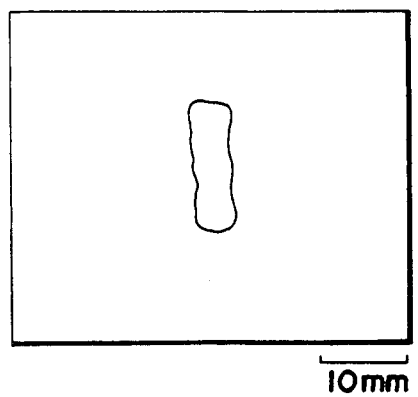
FIG. 2 illustrates an X-ray pin-hole picture of a conventional plasma X-ray source.

The same reference numerals are used to designate similar parts throughout the figures.

Figure 3:
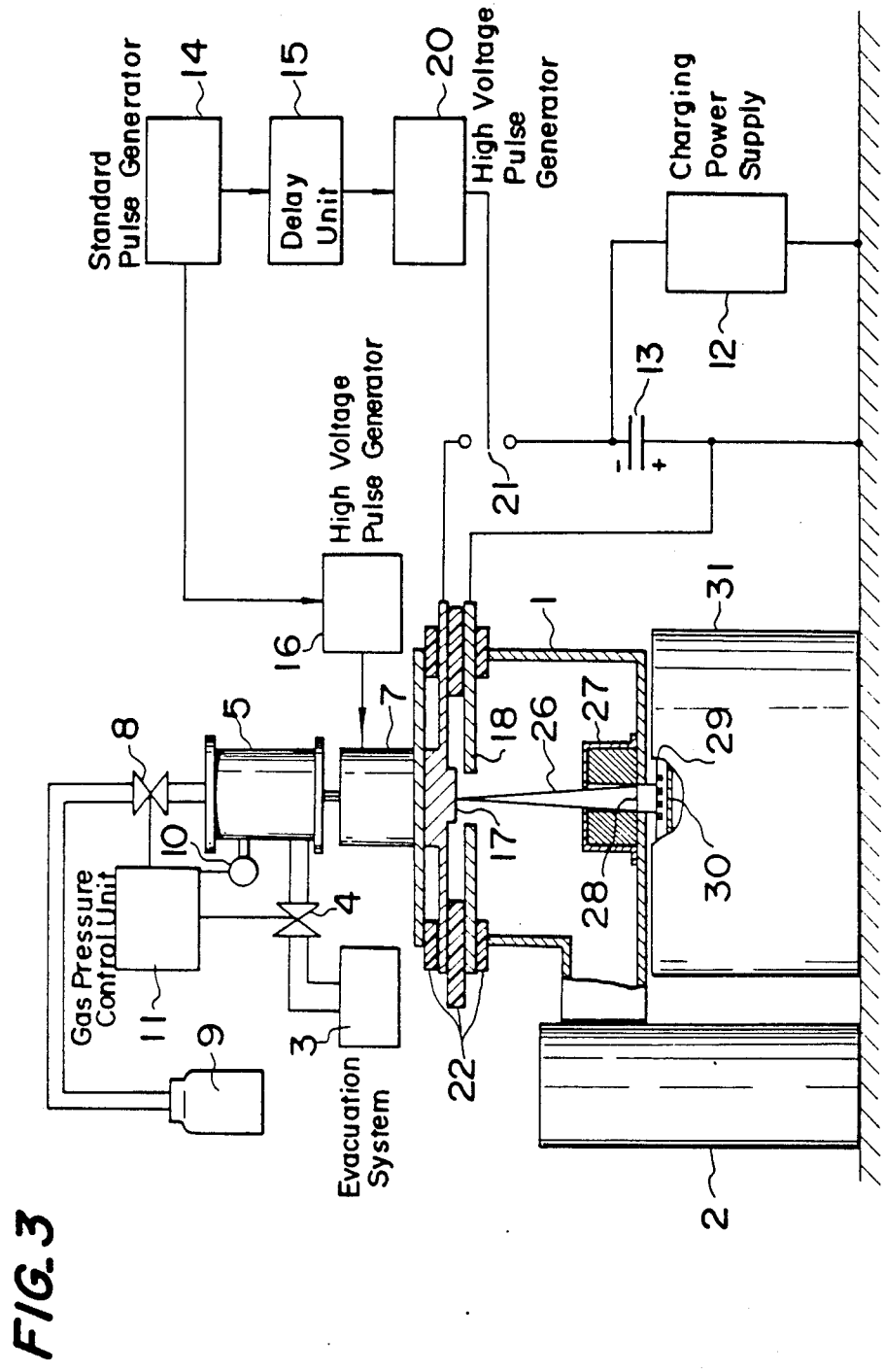
FIG. 3 is a schematic view showing a first embodiment of an X-ray source in accordance with the present invention.

FIG. 3 shows an embodiment of an X-ray source in accordance with the present invention. Reference numeral 1 denotes a vacuum vessel; 2, an evacuation system for the vacuum vessel 1; 3, an evacuation system for adjusting the gas; 4, an evacuation valve for adjusting the gas pressure; 5, a gas buffer vessel; 7, a fast acting puff valve; 8, a gas introducing valve; 9, a vessel containing a gas for discharge; and 10, a gas pressure sensor.

In response to the signal from the gas pressure sensor 10, a gas pressure control unit 11 opens or closes the valves 4 and 8 to control the flow rate of the gas for discharge supplied from the gas vessel 9 to the gas buffer vessel 5 and the flow rate of the gas for discharge evacuated by the evacuation system 3 from the gas buffer vessel, so that the pressure in the gas buffer vessel 5 is controlled. The pressure of the gas plenum in the fast acting puff valve, which is connected to the gas buffer vessel, is controlled by controlling the pressure of the gas buffer vessel. Reference numeral 12 designates a charging power supply; 13, a capacitor which is charged by the power supply 12; 14, a standard pulse generator; 15, a delay unit for delaying the signal from the pulse generator 14; 16, a high voltage pulse generator which is controlled by the signal from the standard pulse generator 14 to drive the fast acting puff valve 7; 17, a high-voltage electrode to which a negative potential is applied and which is connected to the fast acting puff valve 7 and which can be made of W-Cu alloy or carbon; 18, a grounding electrode made of a W-Cu alloy or carbon; 20, a high voltage pulse generator which generates a high voltage pulse in response to the signal generated by the standard pulse generator 14 and delayed by the delay unit 15; 21, a discharge switch adopted to respond to the pulse from the high-voltage pulse generator 20 so as to control the discharge timing of the capacitor 13; 22, an insulator for electrically insulating the electrode 17 from the electrode 18; 26, an X-rays emitted from the plasma; 27, a charged particle remover disposed along the path of the X-ray in the vacuum vessel 1 in such a way that it produces a magnetic field perpendicular to the axis of the electrodes 17 and 18 so that ions and electrons emitted from the discharged plasma may be deflected; 28, an X-ray extraction window made of a Be thin film, an Al thin film or a polymer thin film; 29, an X-ray mask; 30, a wafer to be exposed; 31, an aligner for controlling the positions of the mask 29 and the wafer 30.

In operation, the vacuum vessel 1 is evacuated to $10^{-4}$–$10^{-5}$ Torr by the evacuation system 2. Thereafter, the evacuation system 3 for pressure adjustment is activated and the evacuation valve 4 is opened so that the gas buffer vessel 5 and the fast acting puff valve 7 are evacuated. Next, the gas introduction valve 8 is opened, so that the discharge gas from the discharge gas vessel 9 flows to the gas buffer vessel 5 and the fast acting puff valve 7. When the gas pressure sensor 10 detects a predetermined pressure level of the gas pressure in the gas buffer vessel 5 connected to the plenum, the pressure control unit 11 closes the gas introducing valve 8.

Next, after the capacitor 13 has been charged by the charging power supply 12, the high voltage pulse generator 16 for the fast acting puff valve 7 is activated in response to the signal from the standard signal generator 14, so that the fast acting puff valve 7 is driven. As a result, the discharge gas is injected into the space between the gas introduction electrode 17, to which is applied a high voltage, and the grounding electrode 18, which is disposed in opposed relationship with the gas introduction electrode 17.

The signal from the signal generator 14 is applied to the high voltage pulse generator 20 through the delay unit 15, which is set to coincide with the time when the discharge gas is injected between the electrodes 17 and 18. In response to the high voltage pulse from the pulse generator 20, the discharge switch 21 is actuated, so that a high voltage is applied between the discharge electrodes 17 and 18, which are electrically insulated by the insulators 22. As a result, discharge occurs when the discharge gas is introduced in synchronism with the application of the high voltage pulse. Then, the gas is changed to plasma by the discharge and pinches toward the center of the plasma due to the magnetic field produced by the current flowing through the plasma and the electromagnetic action of the ions and electrons in the plasma. Therefore, a high temperature and high density region is produced along the axis of the electrodes, so that the X-rays 26 are emitted.

In order to replicate a pattern, the X-rays 26 emitted from the plasma are extracted through the charged particle remover 27 disposed in the direction of the axis of the plasma and the X-ray extraction window 28, consisting of a Be thin film extended over the opening of the vacuum vessel 1, so that the pattern of the X-ray mask 29 disposed in the atmosphere is replicated on the wafer 30, which is coated with resist. Alignment between the X-ray mask 29 and the wafer 30 is attained by the aligner 31.

The gas pressure sensor 10 detects the pressure variation in the gas buffer vessel 5 when the discharge gas is introduced through the fast acting puff valve 7. In response to the signal from the gas pressure sensor 10, the control unit 11 opens or closes the evacuation valve 4 and the gas introducing valve 8 in such a way that the pressure variation may be compensated. As a result, the pressure in the gas buffer vessel is maintained at a predetermined pressure of the order of 150–1000 Torr.

Therefore, the pressure of the puff which is introduced through the fast acting puff valve 7 can be always set at a predetermined pressure. In general, it is preferable that the time required for the gas between the electrodes to reach a pressure (a few Torr - 100 Torr) suitable for discharge is short. Furthermore, it is preferable that a gas jet with the least gas diffusion is produced steeply. However, when the pressure of the injected gas is high, the pressure of the gas between the electrodes increases rapidly even after the pinch of the plasma is terminated. Therefore, the discharge in the high pressure gas is maintained by the damping oscillation current which flows after the pinch. In the present invention, the gas is injected after the gas pressure of the plenum is controlled at a predetermined pressure level (for instance, 150–1000 Torr) by the pressure control unit 11, so that it is possible to control the pressure at which the pressure between the electrodes becomes maximum to an optimum discharge pressure (a few Torr - 100 Torr).

Accordingly, even when the discharge is maintained by the damping oscillation current for a long time after the pinch of the plasma, the gas pressure between the electrodes is maintained at a pressure in the range of 150–300 Torr and the gas density between the electrodes reaches $10^{19}$ cm$^{-3}$ at most, so that the current is prevented from being concentrated locally and consequently the electrodes are prevented from being melted.

For example, in the case of a discharge with conventional electrodes as shown in FIG. 1, when the discharge is started by injecting gas of a pressure on the order of 3 atm. in the plenum, the center end portion of the gas injection electrode as shown in FIG. 1 is consumed, so that a crator having a diameter of 7–8 mm and a depth of 10 mm is formed after 1,000 discharges. On the other hand, according to the present invention, if a discharge occurs at a low plenum gas pressure on the order of 300 Torr, a crator having a diameter of only 4–5 mm and a depth of only 2 mm is formed at the leading end of the electrode due to the consumption, even after 10,000 discharges. Thus, the consumption of the electrode is remarkably reduced in the present invention.

In the case of the injection of a gas at a plenum gas pressure in the range of 150–1000 Torr, it is required to increase the diameter of a gas introduction passage and simultaneously shorten the length thereof so as to increase its conductance so that the rising gradient or slope of the injected gas is increased. In the present invention, however, as compared with the conventional method where a gas is injected at a high pressure, it cannot be avoided that the rising gradient of the gas is small. Therefore, in the present invention, the shape of the discharge electrode which defines the plasma is so determined that the discharge is stabilized.

FIG. 4 shows the construction of the electrodes 17 and 18 fabricated in view of the above-described consideration, together with the construction of the fast acting puff valve 7. The vacuum vessel 1 is provided with a high voltage input flange 41 which serves as a top wall and a current passage. The input flange 41 is provided with a gas ejection nozzle 42. A molded insulator 44 of nylon or the like is disposed above the gas ejection nozzle 42 to define a gas plenum 43. The insulator 44 has a hole 40 through which a piston 45 extends so that the piston 45 reciprocates in the gas plenum 43. A solenoid coil 46 for moving the piston 45 vertically is embedded in the insulator 44. The piston 45 can be made of a light metal such as aluminum or duralumin which generates a current in response to the change of the magnetic lines of force of the coil 46. A pulse voltage is applied to the solenoid coil 46 from the high voltage pulse generator 16 so that the piston 45 is immediately lifted. A buffer 48 for stopping the piston 45 is attached to the bottom surface of the top plate of the fast acting puff valve 7. The buffer 48 has an opening in communication with a passage 47 which in turn communicates with the gas buffer vessel 5. The top of the piston 45 is engageable with the buffer 48. The flange 41 is provided with a sealing member 49 such as an O-ring adapted to engage with the bottom surface of the piston 45 so as to vacuum-seal the gas plenum 43. The discharge gas which flows through the passage 47 is introduced into the gas plenum 43 when the piston 45 is moving downward. When the piston 45 is moved upward rapidly in response to the application of the high voltage pulse from the pulse generator 16 to the solenoid coil 46, the discharge gas flows downward through the gas ejection nozzle 42. When the application of the high voltage pulse from the pulse generator 16 to the solenoid coil 46 is terminated, the piston 45 moves downward by its own weight and the vacuum in the vacuum vessel 1, so that the discharge gas is introduced into the gas plenum 43 again through the passage 47.

A grounded flange 50 which forms a current return circuit is disposed via the insulator 22 below the flange 41. The electrode 17 having double cylinders is disposed below the flange 41. The flange 41 has an opening 17E which communicates with the gas ejection nozzle 42 of the flange 41. A gas introduction passage 51 is defined between the outer wall 17A and the inner wall 17B of the electrode 17. The outer wall 17A and the inner wall 17B of the electrode 17 are joined integrally by a ring 17C. The opening 17E and the gas introduction passage 51 are communicate with each other through a plurality of openings 17D which are spacedly arranged on the circumference of the ring 17C. A cooling water pipe 52 for cooling the electrode 17 is disposed around the electrode 17. A cylinder 53 extends downwardly from the undersurface of the flange 50. An inner cylinder 54 extends upwardly and spaced apart from the bottom surface of the cylinder 53 by a suitable distance. The lower cylinder 54 forms the electrode 18, which is grounded. The annular upper end of the grounded electrode 18 is substantially in opposed relationship with the gas introduction passage 51. The grounded electrode 18 may have a plurality of gas evacuating openings 55 on the circumferential surface of the electrode 18. Cooling water pipes 56 are disposed on the surface of the grounded electrode 18. A beam reflector 57 is disposed below the grounded electrode 18 in an inclined manner so as to cover the cylinder 54. The beam reflector 57 has at least one inclined reflecting plate having an X-ray extraction window 58 in coaxial relationship with the electrodes 17 and 18. A charged particle evacuating port 59 is provided at the end of the beam reflector 57 so that the charged particles reflected by the beam reflector 57 pass through the evacuating port 59.

Still referring to FIG. 4, reference numeral 61 denotes a gas jet ejected from the gas introduction passage 51; 62, a current flowing between the electrodes 17 and 18; 63, a plasma pinched in the directions indicated by the arrows; and 64, the loci of the charged particles emitted from the plasma 63.

When the piston 45 of the fast acting puff valve 7 is opened, the gas in the gas plenum 43 forms the gas jet 61 in the form of a hollow cylinder through the gas introduction passage 51 of the electrode 17 between the electrode 17 and the grounded hollow cylindrical electrode 18. In order to increase the conductance of the gas introduction passage, the diameter of the gas ejection nozzle 42 is determined to be 10 mm or more and the gas introduction passage 51 is diverged downwardly so that the Mach number of the gas ejected from the gas introduction passage 51 is increased.

When a negative high voltage is applied to the electrode 17, an annular discharge is produced between the lower end of the electrode 17 and the upper end of the grounded cylindrical electrode 18. At the initial stage of the discharge, the electric field is concentrated at the upper end of the lower cylinder 54, which is the portion of the grounded hollow electrode 18 which is the closest to the electrode 17. As a result, the discharge is always started at a predetermined point; that is, the upper end of the electrode 18. This means that the point at which the discharge is started is stabilized. Furthermore, the electric field is concentrated in the form of a ring with a predetermined diameter, so that even if the form of the gas jet 61 collapses after the injected gas jet 61 is diffused, a ring-shaped initial discharge is maintained. As a consequence, the plasma is pinched.

Therefore, even when the gas is injected at the plenum gas pressure of 150-1000 Torr in the gas plenum and the rising slope of the injected gas is not so steep, a ring-shaped initial discharge is produced and the plasma is pinched.

The current 62 which flows in the pinched plasma is ejected from the inner wall of the cylindrical cavity 17B which extends along the axis of the electrode 17 and the inner wall of the grounded electrode 18; that is, the hollow cylinder 54.

Therefore, the current which flows to the electrodes 17 and 18 when the plasma is pinched is supplied from the whole inner surfaces of the electrodes 17 and 18, so that the current is prevented from flowing locally in the electrodes. As a consequence, the electrodes are prevented from being heated and melted due to a localized current flow and the electrode consumption due to the discharge is minimized. Even after 1000 discharges, only small portions of the inner wall surfaces of the electrodes 17 and 18 are consumed. That is, electrode consumption is substantially eliminated. With the electrodes as shown in FIG. 4, when they are made of C or W-Cu, continuous discharges more than $10^5$ times is possible. Furthermore, because the grounded electrode 18 which is in opposed relationship with the electrode 17 is hollow, there is the decreased possibility that the gas ejected from the fast acting puff valve 7 is reflected by the grounded electrode 18, so that the gas jet 61 is produced with a high degree of reproducibility in a very stable manner.

As a result, the plasma is pinched with a high degree of reproducibility in a stable manner; electrode consumption is minimized; and X-rays are emitted from the plasma in a stable manner.

Figure 5A:
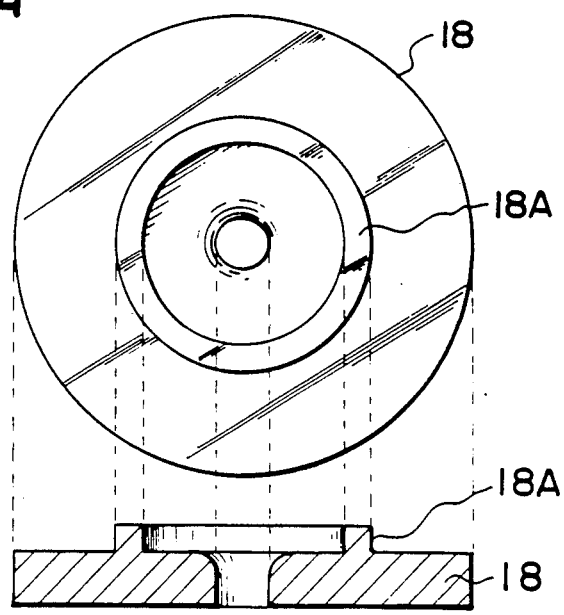
FIGS. 5A and 5B are explanatory views showing two embodiments of the flat electrode, respectively.
Figure 5B:
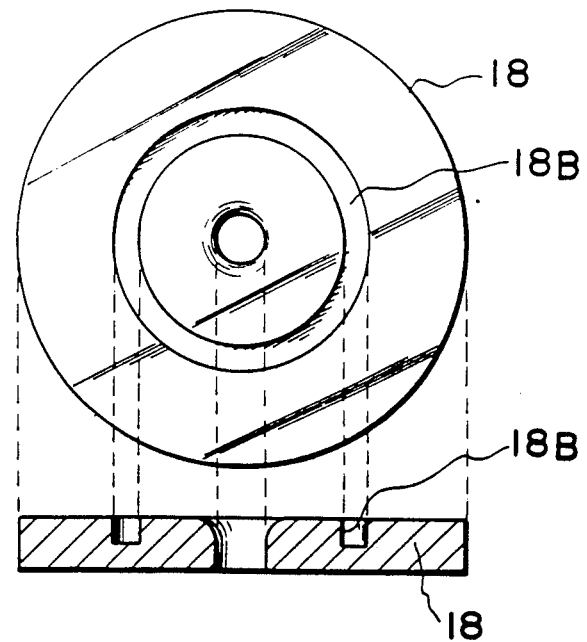
Figure 6:
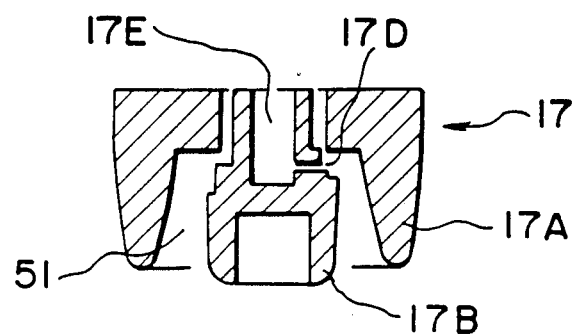
FIG. 6 is a sectional view showing the construction of the upper electrode.

When the pressure of the injected gas is decreased, a stable discharge is ensured and the plasma is pinched even when a flat grounded electrode with an annular ridge as shown in FIG. 5A or an annular groove as shown in FIG. 5B is used. It should be noted that the shape of the opening of the electrode 18 for extracting the X-ray is not limited to circle and any shape can be employed FIG. 6 shows an embodiment of the upper electrode 17 in FIG. 4. The electrode 17 has the cylindrical outer electrode 17A and the hollow cylindrical inner electrode 17B which is disposed within the outer electrode 17A in coaxial relationship therewith and is electrically connected thereto. The inner electrode 17B has a plurality (for example, eight) of openings 17D formed through the side wall of the inner electrode 17B and circumferentially spaced apart from each other. The gas flows into the gas introduction groove 51 between the outer wall of the inner electrode 17B and the inner wall of the outer electrode 17A through these openings 17D.

Figure 7A:
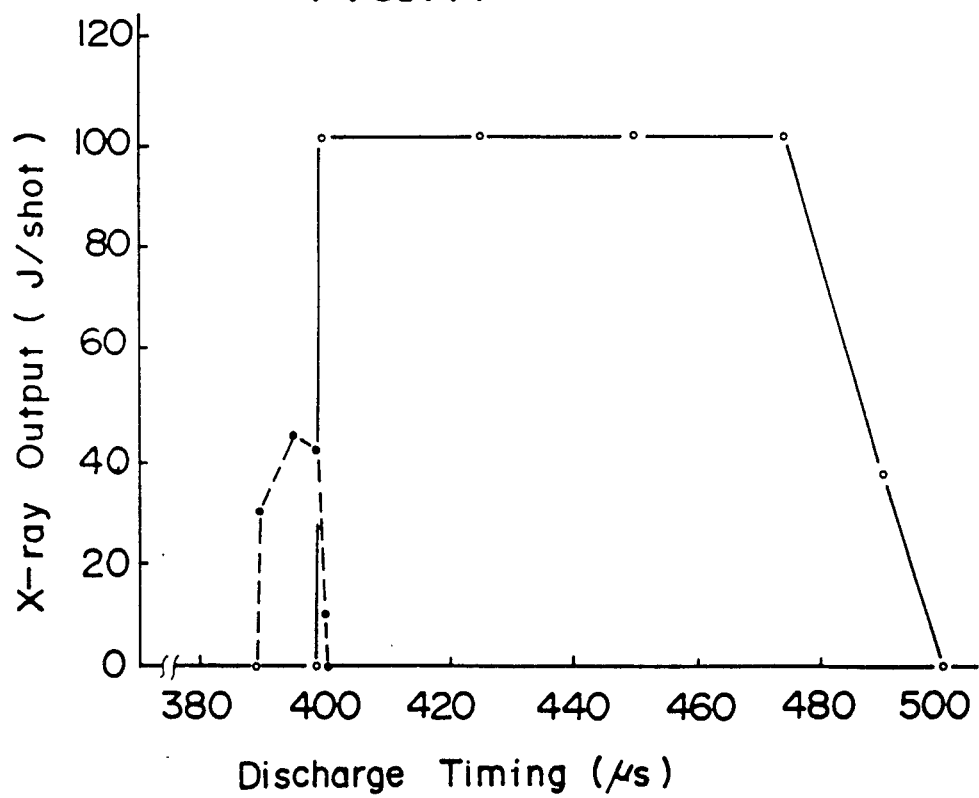
FIG. 7A illustrates the relationships between the X-ray output and the discharge timing (delay pulser setting time) obtained from the experiments conducted with an X-ray source of the present invention and a conventional X-ray source, respectively.

FIG. 7A shows illustrates experimental results of the relationship between the X-ray output obtained from the X-ray source of the present invention as shown in FIG. 3 and the discharge timing (that is, the time set by the delay unit 15 shown in FIG. 3). The X-ray output (J/shot) emitted by one discharge is plotted along the ordinate and the discharge timing ($\mu$s) along the abscissa. The white circles show the results of the experiments in which the discharges were produced after the pressure of the gas plenum is set at a low gas pressure (300 Torr or 0.4 atm.) and the gas is injected in accordance with the present invention, while the black dots show the experimental results when a gas was injected at a high pressure as shown in FIG. 1 in a conventional manner. That is, the high pressure was 2300 Torr (3 atm.). The discharge energy was 3 kJ in both cases. The same discharge circuit was used. According to the conventional method, the allowance of the discharge timing that the plasma is pinched and discharged is 10 $\mu$s between the timings of 390 $\mu$s–400 $\mu$s. Thus, it is seen that the gas is injected rapidly at a high flow rate so that the gas pressure between the electrodes 17 and 18 rises rapidly within a few microsends, because of the fact that the timing interval is 10 $\mu$s.

On the other hand, according to the present invention, the gas is injected at a pressure within a range of 150–1000 Torr and the hollow cylindrical electrodes are used. As a result, the plasma is pinched with a wider margin of a discharge timing of about 100 $\mu$s between the timings of 400 $\mu$s and 500 $\mu$s. This allowance is ten times as wide as the discharge timing margin of 10 $\mu$s in the conventional method. Therefore, in the present invention it is found that the gas pressure between the discharge electrodes is maintained at an optimum level for a long time of about 100 $\mu$s and that even if the injected gas jet is diffused and collapsed after the elapse of a period longer than 50 $\mu$s since the gas was injected between the electrodes 17 and 18, a stable annular initial discharge is produced, so that the plasma is pinched. In the experiments conducted by the inventors, the pulse width of the injected gas was on the order of 100 $\mu$s, so that the gas pressure between the electrodes 17 and 18 was always maintained at an optimum level at which the plasma is pinched and does not increase to a high pressure.

The X-ray output is increased higher by two or three times than the X-ray output obtained by the conventional method. One reason is that the hollow cylindrical electrode 18 is used in the present invention, so that the length of the pinched plasma is not limited, and accordingly a long pinched plasma is established. Consequently, the inductance of the plasma is increased, so that the electric energy stored in the capacitor is effectively injected into the plasma. Another reason is that the current flowing through the plasma is supplied from the inner walls of the electrodes, so that the current is prevented from being localized and the pinched plasma exists in a stable manner for a long time. It was recognized that the X-rays were emitted from the plasma during a long time of 2 $\mu$s when the plasma was pinched for a plurality of times and that the life of the pinched plasma was long.

FIG. 7B shows the relationship between the X-ray output and the gas pressure of the plenum and the relationship between the discharge timing margin and the gas pressure of the plenum. It is seen that the X-ray output as well as the discharge timing margin are high when the pressure is equal to or lower than 1000 Torr (1.31 atm.) and especially lower than 760 Torr (1 atm.). When the gas pressure of the plenum is decreased to 500 Torr or less, both the X-ray output and the discharge timing margin are saturated. The lower limit of the plenum gas pressure for the X-ray output and the discharge timing margin was 150 Torr.

Further, the speed of the gas ejected from the path 51 of the electrode 17 mainly depends upon the pressure of the injected gas (i.e., the pressure in the gas plenum 43), the shape of the electrode 17, types of gas to be injected, and so on. The following table shows examples of the speed in the case of Ne gas.

| pressure in the plenum 43 | gas speed |
| --- | --- |
| 20 Torr | 670 m/sec |
| 150 Torr | 1000 m/sec |
| 200 Torr | 1200 m/sec |
| 1000 Torr | 830 m/sec |

As clear from this result, even if the gas pressure of the plenum gas is varied in a relatively wide range, there is no substantial change of the gas speed. Accordingly, it is seen that a gas jet with a steep shape is formed, even if the speed is varied in such a relatively wide range.

As described above, according to the present invention, by decreasing the gas pressure in the plenum lower than the pressure used in the conventional method, stability and reproducibility of discharges are improved and the X-ray output is increased.

FIG. 8 shows the picture of the position of the pinched plasma when a discharge was produced in the plasma X-ray source of the present invention at a gas pressure in the range of 150–1000 Torr and an X-ray pin-hole camera was located along the axis of the electrodes 17 and 18. The resultant picture was obtained by 20 exposures in one picture. It is seen that the X-ray emitting region is as narrow as 2 mm in diameter. This means that the positions of pinched plasmas are stabilized.

FIG. 9 shows the picture of the positions of pinched plasmas taken under the same conditions as described above except that the gas was injected at a high pressure according to the conventional method. It is seen that the range of the positions of pinched plasmas is 5 mm in diameter. That is, the positions of pinched plasmas vary over a wide range as compared with those in FIG. 8. Thus, according to the present invention, the position at which a plasma is pinched is substantially stabilized.

As described above, the experiments show clearly that according to the present invention the X-ray emission efficiency is improved and the position of the pinched plasma is stabilized. It is known that in the case of a proximity X-ray exposure method, the smaller the diameter of an X-ray source, the more sharply a pattern is replicated. It is seen from the picture shown in FIG. 8 that it is advantageous to perform exposure in the direction of the axis of the electrodes. In this case, it becomes necessary to protect the X-ray extraction window from the charged particles emitted from the plasma.

The charged particles are mostly emitted in the direction of the axis of the pinched plasma column Therefore, according to the present invention, as shown in FIG. 4, there is provided the beam reflector 57 in the direction of the axis of the electrodes 17 and 18. The beam reflector 57 has the reflecting plate in which the X-ray extraction window 58 is opened. The reflecting plate is inclined at a predetermined angle relative to the axis of the grounded electrode 18 so that the reflecting plate is directed toward the evacuation system 2 in FIG. 3.

Therefore, when the plasma 63 produced between the electrodes 17 and 18 is injected toward the X-ray extraction window 28 (See FIG. 3) coaxial with the electrodes 17 and 18, the plasma 63 strikes against the reflecting plate of the beam reflector 57 and accordingly has a momentum in a direction different from the injection direction of the plasma 63. As a result, the plasma travelling toward the X-ray extraction window 28 is decreased. Furthermore, the plasma which is directed from the electrodes 17 and 18 toward the X-ray extraction window 58 collides against the plasma reflected from the beam reflector 57, so that the plasma has a momentum component in the direction perpendicular to the axis of the electrodes 17 and 18. As a result, the quality particles (for instance, the plasma and the charged particles) which move toward the X-ray extraction window 28, which is coaxial with the electrodes, is decreased. In addition, the gas discharged from the fast acting puff valve 7 is reflected by the beam reflector 57 so that the amount of the gas which diffuses in the direction of the evacuation system 2 is increased and consequently the time required for evacuating the gas is shortened. The reflecting plate of the beam reflector 57 may have a flat, curved or conical reflecting surface.

FIGS. 10 and 11 show amounts of the charged particles emitted by the discharges in the apparatus shown in FIG. 4 without the provision the charged particle remover 27 and the beam reflector 57. Here, Ne gas was used to produce a discharge. The capacity of the capacitor 11 was 3 $\mu$F. The charging voltage was 50 kV. In the measurements, a Faraday cup was placed at a position spaced by 25 cm away from the electrode 18 in the direction of the axis of the electrodes 17 and 18 and a resistor of 2 ohms was connected between the Faraday cup and the ground, so that a voltage across this resistor was measured.

FIG. 10 shows the result obtained when the pressure of the injected Ne gas was 2 atm. It is seen that a negative voltage higher than 300 V was detected. This means that a large amount of electrons are emitted in the direction of the axis of the electrodes 17 and 18.

When a Be thin film was placed as an X-ray extraction window 28 at a position spaced by 20 cm apart from the electrode 18, it was destroyed by one discharge and therefore could not be used again.

FIG. 11 shows the result obtained when the pressure of Ne gas was maintained at a low pressure of 0.4 atm., or 300 Torr, by the pressure control unit 11. It is seen that a negative potential was generated at the same time in FIG. 10. The voltage was, on the order of 70 V, which was less than one quarter of the voltage shown in FIG. 10. As described above, when the pressure of the injected gas is decreased, the amount of charged particles emitted from the plasma between the electrodes in response to the discharge is decreased.

In FIGS. 10 and 11, the plasma pinch time (that is, the period of time from the time that a discharge is started to the time that the plasma is pinched) is on the order of 600 ns in either case and it is considered that the gas densities between the electrodes when the discharge is started are substantially the same the cases of both FIGS. 10 and 11. However, when the gas is introduced at a high pressure as shown in FIG. 10, the gas pressure between the electrodes is rapidly increased and maintained at a high pressure after the pinch. As a result, a large amount of gas is ionized, so that a large amount of charged particles are emitted as shown in FIG. 10.

As described above, when the gas pressure in the plenum is lowered to 150–1000 Torr by means of the pressure control unit, the emission of charged particles is suppressed. As a result, the quantity of the electrons and ions which collide against the electrodes is decreased, so that the consumption of electrodes is minimized. However, even if the pressure of the introduced gas is lowered, the charged particles are still emitted to some extent. As a result, when a Be thin film is placed in the direction of the axis of the plasma, it is damaged after a few discharges.

FIG. 12 shows the charged particles measured under the same conditions as in FIG. 10 when the charged particle remover 27 and the beam reflector 57 were provided.

In FIGS. 10, 11 and 12, one scale of the abscissa represents 500 ns and one scale of the ordinate represents 50 V.

In FIG. 12, no charged particles were detected. That is, the charged particles were completely removed by means of the charged particle remover 27 and the beam reflector 57.

Therefore, according to the present invention, it is possible to provide an X-ray extraction window 28 in the direction of the axis of the electrodes 17 and 18. Furthermore, it is also possible to maintain vacuum by means of the X-ray extraction window 28, because the X-ray extraction window 28 is hardly damaged. As a result, the diameter of the X-ray source as viewed from the wafer to be exposed becomes 2 mm, which is substantially equal to the diameter of the pinched plasma, so that a pattern to be replicated is more sharply focused. Moreover, it is possible to extract the X-rays through the X-ray extraction window into the surrounding atmosphere, so that exposure in the atmosphere is available. As a result, the thermal diffusion of an X-ray mask becomes faster, so that the X-ray mask is not subjected to thermal expansion and that a fine pattern is replicated with a higher degree of accuracy.

When the gas pressure in the plenum is further lowered, the amount of the gas to be injected is decreased, so that the time required for evacuating the vacuum vessel 1 is also shortened. As a result, according to the present invention, it is possible to increase the discharge repetition rate, so that the exposure time is shortened and thus the throughput is improved. Furthermore, it follows that the evacuation system can be made compact in size.

When a gas injecting discharge was produced at a plenum gas pressure in the range of 150–1000 Torr according to the present invention, a Be thin film which was 10 μm in thickness and was placed at a position spaced by 30 cm apart from the plasma along the axis of the electrodes was not damaged. Furthermore, the volume of the injected gas was less, so that it was easy to evacuate the gas from the vacuum vessel. As a result, it was possible to perform the discharge about three times per second.

When a negative potential is applied to the electrode on the side of the fast acting puff valve and the electrode in opposed relationship with the above-mentioned electrode is grounded, the charged particles which are emitted from the pinched plasma toward the X-ray extraction window consist substantially of electrons which are easily deflected by a magnetic field. FIGS. 10 and 11 show that the electrons were detected. When the electrode on the side of the X-ray extraction window is grounded, no spark is produced between the grounded electrode and the charged particle remover 27, and between the X-ray extraction window and the vacuum vessel during the discharge. As a result, the distance between the plasma and the wafer 30 can be decreased and accordingly the exposure time can be shortened.

When the plasma X-ray source is disposed above the wafer and the mask aligner, the wafer can be maintained at a horizontal position while the wafer is exposed. As a result, the aligner can be simplified in construction. It is also possible in a simple manner to dispose the plasma X-ray generator below the wafer and the mask aligner.

As described above, according to the present invention, even if the X-ray is emitted in the direction of the axis of the plasma of the plasma X-ray source, the damage to the X-ray extraction window caused by the plasma is prevented. Moreover, the electrode consumption due to the discharge is minimized. As a result, the highly bright X-rays can be obtained through the X-ray extraction window in a stable manner. Moreover, according to the present invention, the discharge gas is injected at a pressure in the range of 150–1000 Torr, so that the injected gas can be evacuated at a high speed. As a result, there is provided a plasma X-ray source in which the discharge can be performed continuously at a high repetition rate of a few Hz. The diameter of the X-ray source is small and the X-ray output is high, so that there is provided a plasma X-ray source for replicating a fine pattern at a high yield.

Furthermore, according to the present invention, a strong X-rays are emitted within a short period of time, so that the present invention can be utilized in X-ray annealing, CVD, etching and so on. Moreover, the present invention can be utilized as a X-ray source for analyzing high speed phenomena, for various analysis and for medical and industrial purposes.

In the embodiments as shown in FIGS. 3 and 4, the beam reflector 57 is disposed on the side of the grounded electrode 18 and the charged particle remover 27 is disposed under the vacuum vessel 1 separately from the charged particle remover 27. Therefore, the charged particles which are not reflected by the beam reflector 57 and pass through the X-ray extraction window 58 are trapped by the charged particle remover 27.

Figure 13:
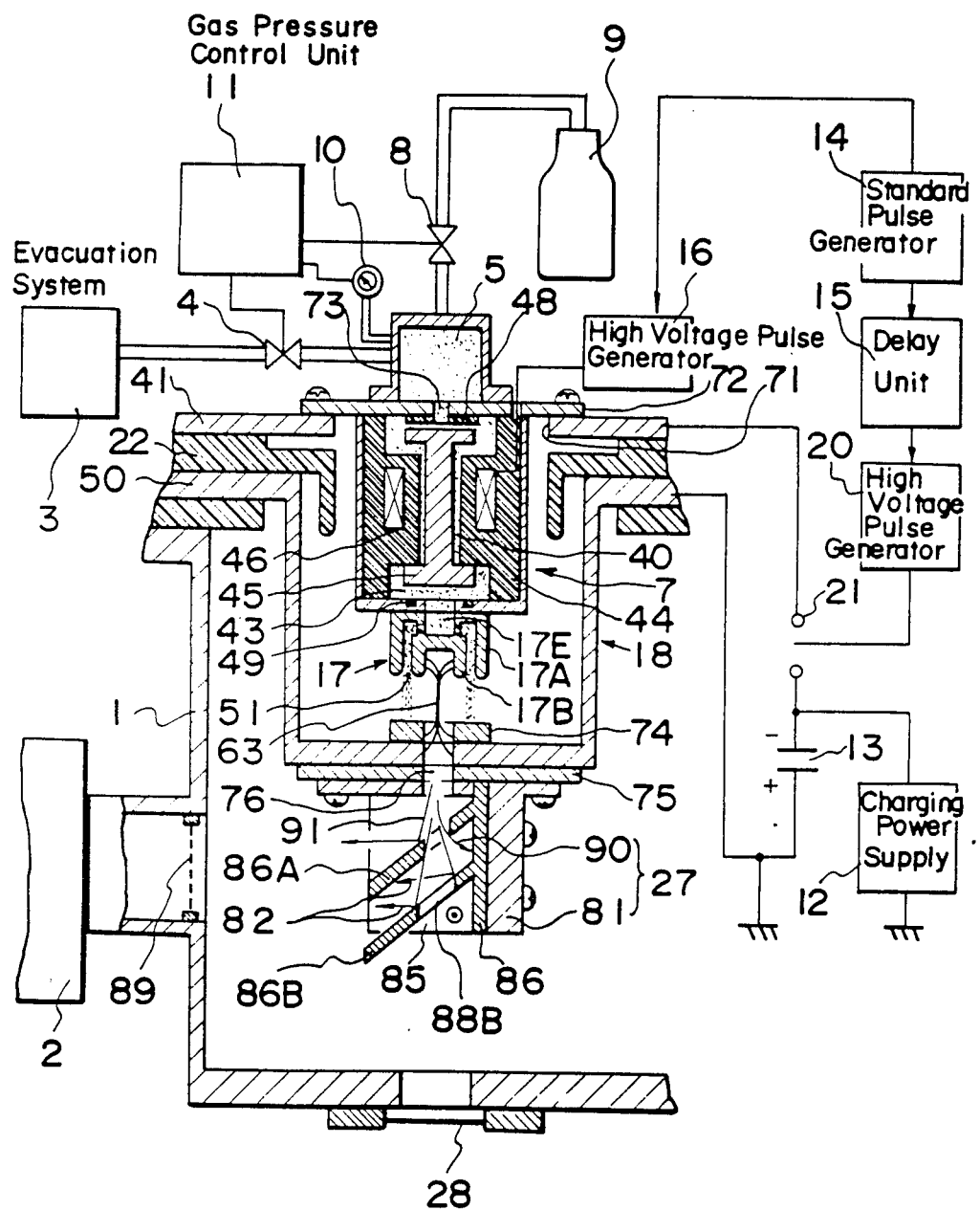
FIG. 13 is a schematic view showing another embodiment of an X-ray source in accordance with the present invention.

On the other hand, in an embodiment of the present invention as shown in FIG. 13, a beam reflector and a charged particle remover are constructed as an integral structure. Here, the portions corresponding to those in FIGS. 3 and 4 are denoted by the same reference numerals.

Referring now to FIG. 13, the high voltage input flange 41 has an opening 71 which accommodates the fast acting puff valve 7 and which is closed by a flange 72 for holding the valve 7 in position. The flange 72 also has an opening 73 which communicates with the gas buffer vessel 5. The fast acting puff valve 7 extends downwardly from the flange 72. In this embodiment, the electrode 18 is in the form of a cylinder in which both the fast acting puff valve 7 and the electrode 17 are housed. An electrode 74 is disposed at the bottom of the cylindrical electrode 18 in opposed relationship with the electrode 17. A magnetic shielding plate 75 is also attached to the bottom of the cylindrical electrode 18. An X-ray extraction hole 76 opens through the electrode plate 74, the bottom plate of the cylindrical electrode 18 and the magnetic shielding plate 75. The charged particle remover 27 as shown in FIG. 14 is attached to the magnetic shielding plate 75.

Referring to FIG. 14, the charged particle remover 27 has a yoke 81 for establishing a magnetic circuit, permanent magnets or electromagnets 82 and 83 which are attached to the opposed legs 81A and 81B of the yoke 81 so as to deflect the charged particles, and protective plates 84 and 85 for the respective magnets 82 and 83. A beam reflector plate 86 is disposed in an inclined manner between the protective plates 84 and 85. The upper end of the beam reflector plate 86 is securely joined to a supporting member 87 which in turn is securely joined to the yoke 81. The magnets 82 and 83 are so disposed that the N pole of one magnet is in opposed relationship with the S pole of the other magnet and that the strength of the magnetic field between the magnets 82 and 83 is maximized by the arrangement of the yoke 81. Only one beam reflector plate 86 may be used, but in this embodiment, two beam reflector plates 86A and 86B are provided as shown in FIG. 13. The beam reflector 86A has an X-ray extraction window 88A while the beam reflector 86B has an X-ray extraction hole 88B. The upper X-ray extraction hole 88A is smaller in size than the lower X-ray extraction hole 88B. These particle beam reflectors 86A and 86B are so inclined that the charged particles reflected by the beam reflectors 86A and 86B are directed toward the evacuation system 2. A charged particle absorbing mesh 89 is disposed at the inlet of the evacuation system 2.

Referring still FIG. 13, reference numeral 90 denotes one example of the loci of the electrons emitted from the plasma 63; 91, one example of the loci of the ions; and 93, one example of the loci of the neutral particles.

Next, the operations of the X-ray source will be described. First the vacuum vessel 1 is exhausted to $10^{-4}$ – $10^{-5}$ Torr by the evacuation system 2. Thereafter, the evacuation system 3 for pressure regulation is activated to open the evacuation valve 4, so that the gas buffer vessel 5 and the fast acting puff valve 7 are evacuated. Next, the gas introduction valve 8 is opened, so that the discharge gas from the gas vessel 9 flows into the gas buffer vessel 5 and the fast acting puff valve 7. After the pressure sensor 10 has detected that a predetermined pressure has been reached, the gas pressure control unit 11 closes the gas introduction valve 8.

Thereafter, the charging power supply 12 charges the capacitor 13 and, in response to the signal from the standard pulse generator 14, the high voltage pulse generator 16 for the fast acting puff valve 7 is activated, so that a magnetic field is produced in the driving coil 46, which is molded with the insulator 44 such as nylon. As a result, the piston 45 is moved upwardly by the electromagnetic repulsion force produced between the piston 45 and the driving coil 46. The discharge gas, which has been introduced into the gas plenum 43 at a predetermined pressure by means of the gas pressure control unit 11, flows through the space between the piston 45 and the vacuum seal O-ring 49 and then through the gas injection nozzle 42 to the openings 17E. The upward movement of the piston 45 is stopped when the piston 45 strikes against the buffer 48 attached to the flange 72 which in turn is securely joined to the high voltage input flange 41 with bolts. Thereafter, the piston 45 moves downward by its own weight and the difference of the pressure in the vacuum vessel 1 and the gas plenum 43. While the piston 45 makes contact with the buffer 48, the gas port 73 of the fast acting puff valve 7 is closed by the piston 45. Simultaneously, the cylindrical wall surface of the piston 45 closes the end of the gas introduction groove 40, so that no gas flows into the gas plenum 43.

The high velocity gas flows pass through the gas openings 17E and the nozzle 51 defined between the outer electrode 17A and the inner electrode 17B into the space defined between the opposed electrodes 17 and 74 and the gas jet is formed between the electrodes 17 and 74. The signal from the signal generator 14 is applied to the high voltage pulse generator 20 through the delay unit 15, which is set at a delayed time that the gas reaches the electrode 74. As a result, in response to the high voltage pulse from the pulse generator 20, the discharge switch 21 is actuated. When the discharge switch 21 is closed, a potential is produced to discharge between the gas introduction electrode 17 and the grounded electrode 74, which is a part of the return electrode 18 connected to the low voltage input flange 50, which is electrically insulated from the high voltage input flange 41 by the insulators 22. The discharge gas which is injected by the fast acting puff valve 7 becomes a plasma. Due to the interaction between the magnetic field produced by the current flowing through the plasma and the plasma, the plasma is converges toward the axis thereof. Thus, a high temperature and high density plasma 63 are produced along the axis of the electrodes 17 and 18.

Not only X-rays, but also high energy electrons, ions and neutral gases, are emitted from the plasma 63 through the X-ray extraction hole 76. The charged particle remover 27 is disposed in the direction of the axis of the plasma 63. Since the Rama radius is small because of the magnetic fields of the magnets, an electron emitted from the plasma 63 travels along the locus 90 and is trapped by the charged particle remover 27. Ions have a large mass, so that the Rama radius is greater. As a result, an ion is slightly deflected, as indicated by the locus 91, by the magnetic field, and is deflected again by the beam reflector 86. An ion which is reflected from the beam reflector 86 is absorbed by a charged particle absorbing mesh 89 before it enters the evacuation system 2 and flows into the ground. Therefore, no current flows through the evacuation system 2. The neutral particles 82 emitted from the plasma are reflected by the beam reflector 86 toward the evacuation system 2 and are discharged into the surrounding atmosphere by the evacuation system 2. The vacuum vessel 1 has the X-ray extraction window 28 coaxial with the plasma, so that the X-rays are emitted into the exterior of the vacuum vessel 1.

Therefore, the pressure variation in the gas buffer vessel 5 is detected by the pressure sensor 10 when the gas is injected between the electrodes 17 and 18 by the fast acting puff valve 7 and, in response to the signal from the gas pressure sensor 10, the pressure control unit 11 opens or closes the evacuation valve 4 and the gas introduction valve 8, thereby compensating the pressure variation. As a result, the pressure in the gas buffer vessel 5 as well as the pressure in the gas plenum 43 are maintained at a predetermined gas pressure level on the order of 150–1000 Torr.

FIG. 15 shows the relationship between the pressure of the injected gas, that is, the pressure in the gas buffer 5 and the gas plenum 43, and the amount of charge (negative charge or electrons) detected when the capacitor 21 of 3 $\mu$F was charged to 50 kV and the Ne gas was introduced into the apparatus shown in FIG. 13 and discharged without the charged particle remover 27, and a Faraday cup was located at the X-ray extraction window 28. In FIG. 15, the Faraday cup output (750 V) with the pressure of the injected gas of 760 Torr (1 atm.) is normalized as 1.0. It is seen that the lower the gas pressure in the plenum the smaller the amount of charge becomes. Therefore, when the gas is injected at a pressure of 300 Torr, the charge amount is reduced to about 10% of the charge amount obtained when the gas is injected at a pressure of 760 Torr. As described above, when the pressure of the injected gas is lowered, the quality of charge particles (electrons) emitted from the plasma is remarkably reduced. However, even when the pressure of the injected gas is lowered, it is impossible to completely remove the charge particles emitted from the plasma.

FIG. 16 shows the results obtained when only the effect of the deflection magnetic field was measured while the beam reflector 86 of the charged particle remover 27 was not provided. More particularly, FIG. 16 shows the relationship between the strength of the deflection magnetic field and the Faraday cup output voltage when the discharge was produced with the pressure of the injected gas being set at 300 Torr. The Faraday cup output is normalized as 1.0 when the strength of the magnetic field is zero. The detected charge (negative charge; that is, electrons) is remarkably reduced when the magnetic field is the order of 400 G and is completely eliminated at 1 kG.

Referring back to FIG. 13, when the capacitor 13 is negatively charged, that is, when the grounded electrode 74 for deriving the X-ray becomes an anode, and when the pressure of the injected gas is set at 300 Torr while the deflection magnetic field is set at 3 kG, neither a positive nor negative signal is detected, even if the detection sensitivity of the Faraday cup is increased. Therefore, the charged particles such as electrons and ions are, almost completely removed.

However, neutral high temperature gases are not deflected by the deflection magnetic field at all. Therefore, the beam reflector 86 as shown in FIG. 13 is provided so as to deflect such neutral particles.

The electrons which come downwardly from the charged particle remover 27 are deflected toward the beam deflector supporting member 87 (See FIG. 13) by the magnetic field produced by the magnets 82 and 83. After all, they impinge against the beam reflector 86 or the magnet protection plates 84 and 85, so that a current flows.

The direction of the momentum obtained when an ion impinges against the beam reflector 86 is the same as the direction of the electromagnetic force exerted to the ions due to the magnetic field produced by the ions and the magnets 82 and 83, so that even a heavy ion is deflected because of the synergistic effect of the beam reflector 86 and the magnets 82 and 83. Furthermore, high velocity neutral particles such as high temperature gases are also reflected by the beam reflector 86, so that the directions of their momentum change and the neutral particles are deflected.

In practice, even if a Be thin film which was 10 μm in thickness is positioned 15 cm immediately below the charged particle remover 27, the Be thin film is not damaged at all.

When the charged particle remover 27 as shown in FIG. 14 is interposed between the X-ray extraction window 28 and the electrodes 17 and 18 which produce the plasma, it is preferable that the charged particle remover 27 is disposed as closely as possible to the plasma, so that the ions which are hardly deflected will not reach the X-ray extraction window 28. Therefore, in the embodiment as shown in FIG. 13, the charged particle remover 27 is directly mounted on the electrode 18. In this case, stable emission of the X-ray from the plasma is adversely affected by the influence of the leakage magnetic fields from the deflection magnets 82 and 83 upon the convergence and pinching of the plasma. Therefore, in order to avoid such adverse effects, the shielding plate 75, which can be made of a material (such as soft iron) with a high permeability and which has the X-ray extraction window 76, is interposed between the charged particle remover 27 and the grounded electrode 18. Thus, stable X-ray emission is ensured without being adversely influenced by the leakage magnetic fields of the deflection magnets 82 and 83.

As described above, according to the present invention, even if the X-ray are extracted in the direction of the axis of the plasma produced by the gas injection type plasma X-ray source, the X-ray extraction window is prevented from being damaged by the plasma and highly bright X-rays are extracted through the X-ray extraction window in a stable manner. Since the X-ray extraction window is not damaged, vacuum in the vacuum vessel 1 can be maintained by the X-ray extraction window, so that the X-rays can be emitted into the atmosphere. As a result, exposure in the atmosphere can be realized. In the case of exposure in the atmosphere, the thermal diffusion of the X-ray mask is facilitated, so that the X-ray mask is prevented from being thermally distorted and a fine pattern can be replicated at a high speed in a stable manner with a high degree of accuracy.

The X-ray source in accordance with the present invention can be utilized for X-ray analysis of high speed phenomena, other various analyses and medical and industrial purposes.

Furthermore, not only X-rays but also ultraviolet rays and vacuum ultraviolet rays are emitted from a plasma, so that an X-ray source in accordance with the present invention can be utilized in various processes for the fabrication of LSI, such as an optical CVD process, an etching process, an annealing process and so on.

What is claimed is:

1. An X-ray source comprising:
   a gas plenum for storing a gas;
   a vacuum vessel;
   a pair of cylindrical electrodes opposed to each other substantially in coaxial relationship in the vacuum vessel;
   a gas valve for injecting the stored gas between said electrodes so that a cylindrical gas jet for the production of a plasma is formed;
   means for applying a voltage between said electrodes to perform discharge therebetween so that a discharge plasma is produced between said electrodes, said plasma being a linear plasma which has a high temperature and a high density and which is produced by the pinch of the plasma due to its own magnetic field produced by the current flowing through the plasma, so that X-rays are emitted from said linear plasma;
   an X-ray extraction window located below said pair of electrodes along the axis of said pair of electrodes; and
   an electrically grounded beam reflector for reflecting charged particles emitted from said plasma, said plasma, and said injected gas, said beam reflector being interposed between said pair of electrodes and said X-ray extraction windowand having a reflecting plane with an X-ray passing window, said reflecting plane being inclined at a predetermined angle relative to the axis of said pair of electrodes,
   wherein at least one of said pair of electrodes has a center hole, and X-rays are extracted in the direction of linear plasma produced substantially along the axis of said pair of electrodes.

2. An X-ray source as claimed in claim 1, wherein the pressure in said gas plenum is so controlled that the maximum gas molecular density of said gas jet does not exceed $10^{19}$ cm$^{-3}$.

3. An X-ray source as claimed in claim 1, wherein said gas valve is a fast acting puff valve which is opened by an electromagnetic force and which is closed by the weight of said gas valve.

4. An X-ray source as claimed in claim 1, wherein one of said pair of electrodes on the side that said X-rays are extracted is grounded, while a negative potential is applied to the other electrode.

5. An X-ray source as claimed in claim 1, wherein one of said pair of electrodes is in the form of a hollow cylinder and is directly coupled to said gas valve, so that the gas is ejected from the interior of said one electrode, and said one electrode has an inner coaxial cylindrical electrode connected electrically to said one electrode.

6. An X-ray source as claimed in claim 7, wherein said pair of electrodes comprise a pair of hollow cylindrical electrodes disposed in coaxial relationship with each other.

7. An X-ray source as claimed in claim 1, further comprising an evacuation system which is coupled to said vacuum vessel to evacuate the inside of said vacuum vessel, and wherein said reflecting plane is opposed to said evacuation system.

8. An X-ray source as claimed in claim 1, wherein said beam reflector has a plurality of charged particle reflecting portions which are spaced apart from each other.

9. An X-ray source as claimed in claim 1, further comprising a charged particle remover which has an X-ray passing window and is coaxial with the axis of said pair of electrodes, said charged particle remover being interposed between said pair of electrodes and said X-ray extraction window located below said pair of electrodes.

10. An X-ray source as claimed in claim 1, wherein said beam reflector has a magnet which is so disposed as to produce a magnetic field for deflecting the incoming charge particles.

11. An X-ray source as claimed in claim 10, wherein said magnetic field is produced in a direction perpendicular to the direction of extracting the X-rays.

12. An X-ray source as claimed in claim 10, wherein the reflecting plane of said reflector is disposed in said magnetic field.

13. An X-ray source as claimed in claim 10, further comprising a magnetic shielding plate which has an X-ray passing window and has a high permeability, said magnetic shielding plate being interposed between said pair of electrodes and said beam reflector.

14. An X-ray source as claimed in claim 1, wherein the pressure in said gas plenum is in the range of 150 Torr to 1000 Torr.

15. An X-ray lithography method comprising the steps of:

forming a gas jet for the production of a plasma between a pair of cylindrical electrodes substantially in coaxially opposed relationship with each other in a vacuum vessel, at least one of said pair of electrodes having a hole for passing X-rays;

applying a voltage between said pair of electrodes to perform discharge therebetween so that a discharge plasma is produced between said pair of electrodes, a linear plasma with a high temperature and a high density being produced by the pinch of the plasma due to its own magnetic field produced by the current flowing through the plasma, so that X-rays are emitted from said linear plasma and derived in the direction of the axis of said linear plasma produced substantially along the axis of said pair of electrodes;

extracting said X-rays through both an X-ray passing window of an electrically grounded beam reflector and an X-ray extraction window located below said pair of electrodes along the axis of said pair of electrodes, said beam reflector being interposed between said pair of electrodes and said X-ray extracting window and having a reflecting plane which is inclined at a predetermined angle relative to the axis of said pair of electrodes so that charged particles emitted from said plasma, said plasma, and gases are reflected by said reflecting plane; and exposing a wafer by the emitted X-rays through an X-ray exposure mask, said X-ray exposure mask and said wafer being so arranged along the axis of said linear plasma that the surfaces of said X-ray exposure mask and said wafer are perpendicular to the axis of said linear plasma.

16. An X-ray lithography method as claimed in claim 15, wherein the surfaces of said X-ray exposure mask and said wafer are disposed substantially horizontally.

17. An X-ray lithography method as claimed in claim 15, wherein the pressure of the gas to be injected to form said gas jet is in the range of 150 Torr to 1000 Torr.

18. An X-ray lighography method as claimed in claim 15, wherein the pressure of the gas to be injected to form said gas jet is in the range of 150 Toor to 500 Torr.

* * * * *